(12) United States Patent
Tojyo

(10) Patent No.: US 6,587,020 B2
(45) Date of Patent: Jul. 1, 2003

(54) MULTILAYER LC COMPOSITE COMPONENT WITH GROUND PATTERNS HAVING CORRESPONDING EXTENDED AND OPEN PORTIONS

(75) Inventor: Atsushi Tojyo, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/942,497

(22) Filed: Aug. 30, 2001

(65) Prior Publication Data

US 2002/0101303 A1 Aug. 1, 2002

(30) Foreign Application Priority Data

Aug. 31, 2000 (JP) ........................................ 2000-263353

(51) Int. Cl.[7] .............................. H03H 7/01; H01P 1/203
(52) U.S. Cl. ........................ 333/185; 333/177; 333/204
(58) Field of Search ................................. 333/177, 185, 333/204, 205

(56) References Cited

U.S. PATENT DOCUMENTS 5,392,019 A * 2/1995 Ohkubo .................. 333/185 X
5,822,174 A * 10/1998 Yamate et al. .......... 333/185 X

FOREIGN PATENT DOCUMENTS

GB 2303495 A * 2/1997 ............ H03H/7/00
JP 4-11022 U * 9/1992

OTHER PUBLICATIONS

Williams, Electronic Filter Design Handbook, 1981, McGraw–Hill, New York, NY, pp. 5–19.*

* cited by examiner

Primary Examiner—Justin P. Bettendorf
(74) Attorney, Agent, or Firm—Keating & Bennett, LLP

(57) ABSTRACT

A multilayer LC composite component minimizes the inductances of ground patterns to prevent electromagnetic waves from leaking outside the component. The multilayer LC composite component includes ground patterns having large areas arranged in the upper and lower sections of the component, with inductor patterns and resonant capacitor patterns arranged between the ground patterns. The ground patterns have portions extended in different positions such that no clearance is left between the extended portions in plan view.

18 Claims, 7 Drawing Sheets

MULTILAYER LC COMPOSITE COMPONENT WITH GROUND PATTERNS HAVING CORRESPONDING EXTENDED AND OPEN PORTIONS

BACKGROUND OF THE INVENTION

1. Field of the Invention

The present invention relates to multilayer LC composite components. More particularly, the present invention relates to multilayer LC composite components used in mobile communication apparatuses such as mobile phones.

2. Description of the Related Art

As a conventional multilayer LC composite component of this kind, there is known a multilayer LC filter having a structure as shown in FIG. 12. In a multilayer LC composite component 1, inductor patterns 8 and 9 and resonant capacitor patterns 10 and 11 are provided on a ceramic sheet 5, a ground pattern 12 is disposed on a ceramic sheet 3, a ground pattern 13 is disposed on a ceramic sheet 4, a ground pattern 14 is disposed on a ceramic sheet 6, and a ground pattern 15 is disposed on a ceramic sheet 7.

The ceramic sheets 2 to 7 are stacked to be integrally burned so as to constitute a multilayer body 17 as shown in FIG. 13. The multilayer body 17 includes an input terminal 18, an output terminal 19, and ground terminals G1 and G2. The input terminal 18 is connected to an extended portion 8a of the inductor pattern 8. The output terminal 19 is connected to an extended portion 9a of the inductor pattern 9. The ground terminal G1 is connected to the grounded portions of the inductor patterns 8 and 9 and one end of each of the ground patterns 12 to 15. The ground terminal G2 is connected to the resonant capacitor patterns 10 and 11 and the remaining ends of the ground patterns 12 to 15.

In the above-described LC filter 1, an LC resonator Q1 is defined by an inductor L1 composed of the inductor pattern 8, a resonant capacitor C1 that is defined by arranging the resonant capacitor pattern 10 opposite to the open-circuited end of the inductor pattern 8, and a capacitor C3 that is defined by arranging the inductor pattern 8 opposite to the ground patterns 12 to 15. Similarly, an LC resonator Q2 is defined by an inductor L2 composed of the inductor pattern 9, a resonant capacitor C2 that is defined by arranging the resonant capacitor pattern 11 opposite to the open-circuited end of the inductor pattern 9, and a capacitor C4 that is defined by arranging the inductor pattern 9 opposite to the ground patterns 12 to 15. In addition, in a direction in which the ceramic sheets 2 to 7 are stacked, a pair of the ground patterns 12 and 13 are arranged adjacent to each other above the LC resonators Q1 and Q2, and a pair of the ground patterns 14 and 15 are arranged adjacent to each other below the LC resonators Q1 and Q2.

In the multilayer LC filter, preferably, the widths of the extended portions of the ground patterns are broadened to reduce the inductances of the extended portions. On the other hand, such an arrangement causes separations to occur between the ground patterns and the ceramic sheets. This results from loosen bonds between the ground patterns and the ceramic sheets due to deteriorated contacts between them. Thus, usually, similar to the extended portions 12a to 15a of the ground patterns 12 to 15 shown in FIG. 12, the widths of the extended portions are narrowed and the extended portions are arranged to have a plurality of separate portions.

However, as shown in FIG. 14, the extended portions 12a and 13a of the ground patterns 12 are arranged in the same positions in plan view, and so are the extended portions 14a and 15a of the ground patterns 14 and 15. As a result, magnetic fields generated at the extended portions 12a and 13a converge on the same portions, and the same phenomenon happens to the extended portions 14a and 15a. Thus, in the conventional multilayer LC filter 1, the extended portions of the ground patterns 12 to 15 result in having significantly large inductances. Additionally, openings 16 are formed between the extended portions 12a and 12a and also formed between the extended portions 13a and 13a. However, this arrangement causes a problem in which electromagnetic waves generated inside the LC filter 1 leak to the outside through the openings 16.

Furthermore, when the positions of the extended portions 12a to 15a deviate due to variations occurring in the manufacturing process, the areas of the openings 16 of the ground patterns 12 to 15 change in plan view. Then, the capacitances of the capacitors C3 and C4 composed of the inductor patterns 8 and 9 and the ground patterns 12 to 15 are changed. This causes variations in the filter characteristics of the filter 1.

SUMMARY OF THE INVENTION

In order to overcome the problems described above, preferred embodiments of the present invention provide a multilayer LC composite component that minimizes the inductances of ground patterns to prevent electromagnetic waves from leaking outside the component.

According to a preferred embodiment of the present invention, a multilayer LC composite component includes a plurality of insulation layers stacked to define a multilayer body, an inductor and a capacitor arranged in the multilayer body to define LC resonators, at least two ground patterns arranged on two different insulation layers that are adjacent to each other, and the ground patterns arranged above or below the LC resonator in the direction in which the insulation layers are stacked, the two ground patterns electrically connected to an external ground electrode via extended portions respectively, the external ground electrode disposed on the multilayered body, wherein the extended portions of the ground patterns are arranged in different positions in plan view.

In addition, the LC composite component may further include a via-hole connected in the direction in which the insulation layers are stacked to define the inductor, and a capacitor pattern arranged to define the capacitor, in which one end of each inductor is electrically connected to the capacitor pattern of the capacitor defining the LC resonator and the other end of the inductor is electrically connected to the ground pattern.

With the above-described unique and novel arrangement, since the extended portions that are disposed on the different insulation layers are arranged in different positions in plan view, magnetic fields generated at the extended portions do not converge on the same portions. As a result, this arrangement minimizes the inductances of the extended portions.

Furthermore, the extended portions of the plurality of ground patterns may be arranged in a state in which no clearance is left between the extended portions in plan view. This arrangement prevents electromagnetic waves that are generated inside the component from leaking outside.

Other features, elements, characteristics, and advantages of the present invention will become more apparent from the following detailed description of the preferred embodiments of the present invention with reference to the attached drawings.

DETAILED DESCRIPTION OF PREFERRED EMBODIMENTS

With reference to the attached drawings, a description will be provided of preferred embodiments of a multilayer LC composite component according to the present invention.

Figure 1:
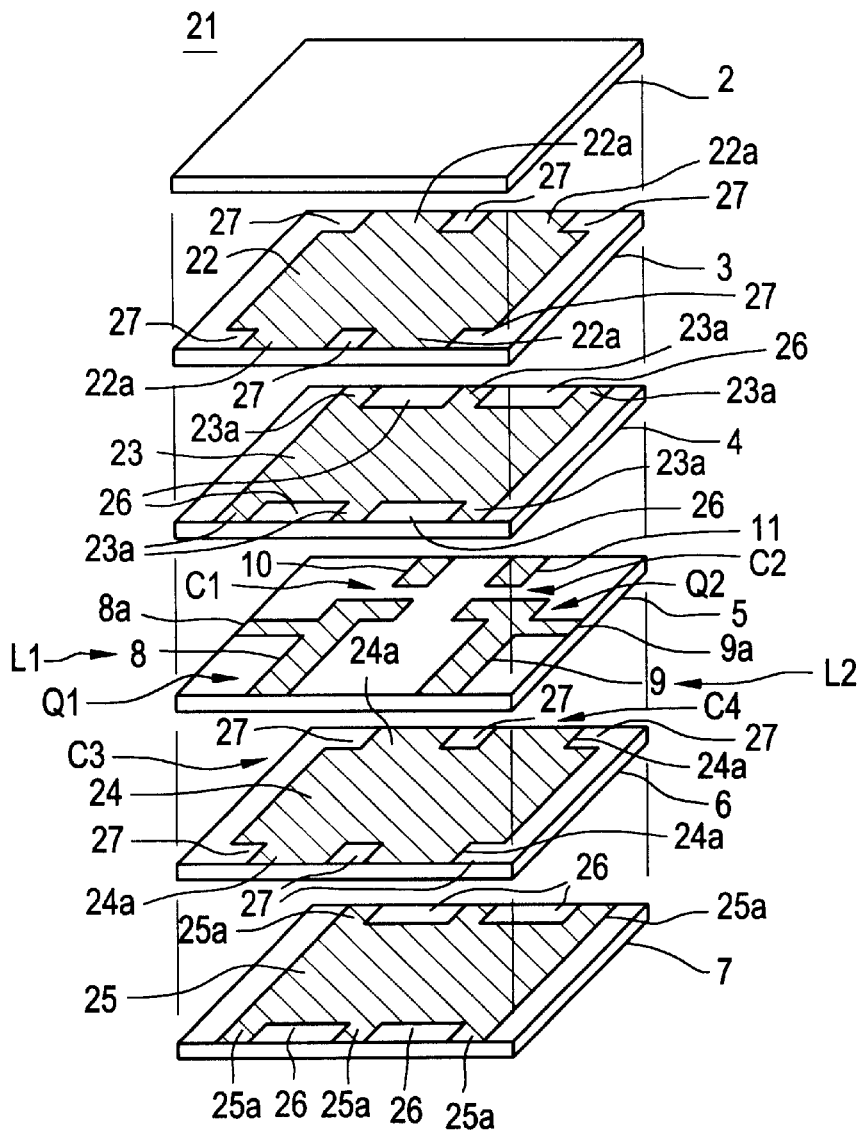
FIG. 1 shows an exploded perspective view of a multilayer LC composite component according to a preferred embodiment of the present invention.
Figure 2:
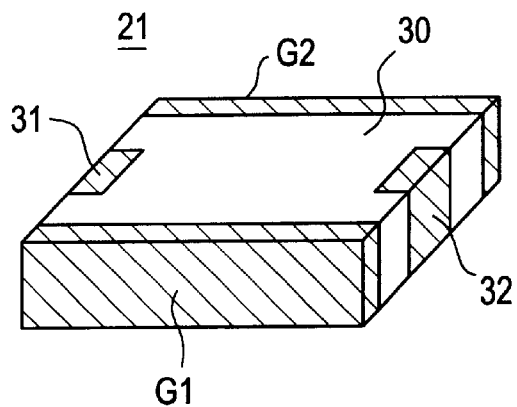
FIG. 2 shows an external perspective view of the multilayer LC composite component according to a preferred embodiment of the present invention.
Figure 3:
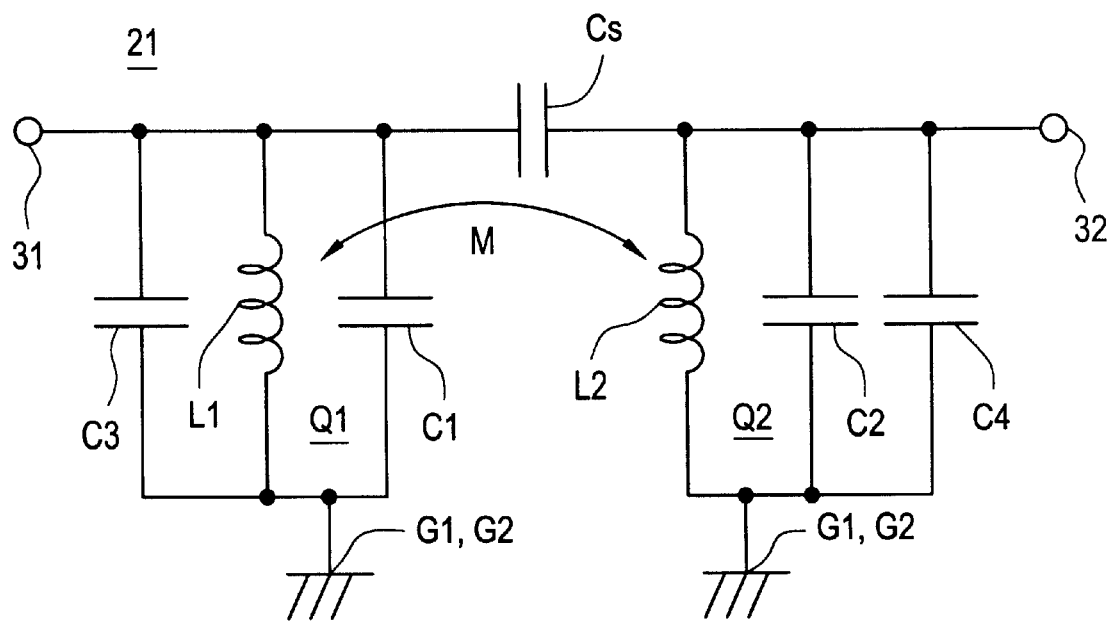
FIG. 3 shows an electrically equivalent circuit diagram of the multilayer LC composite component shown in FIG. 2.
Figure 12:
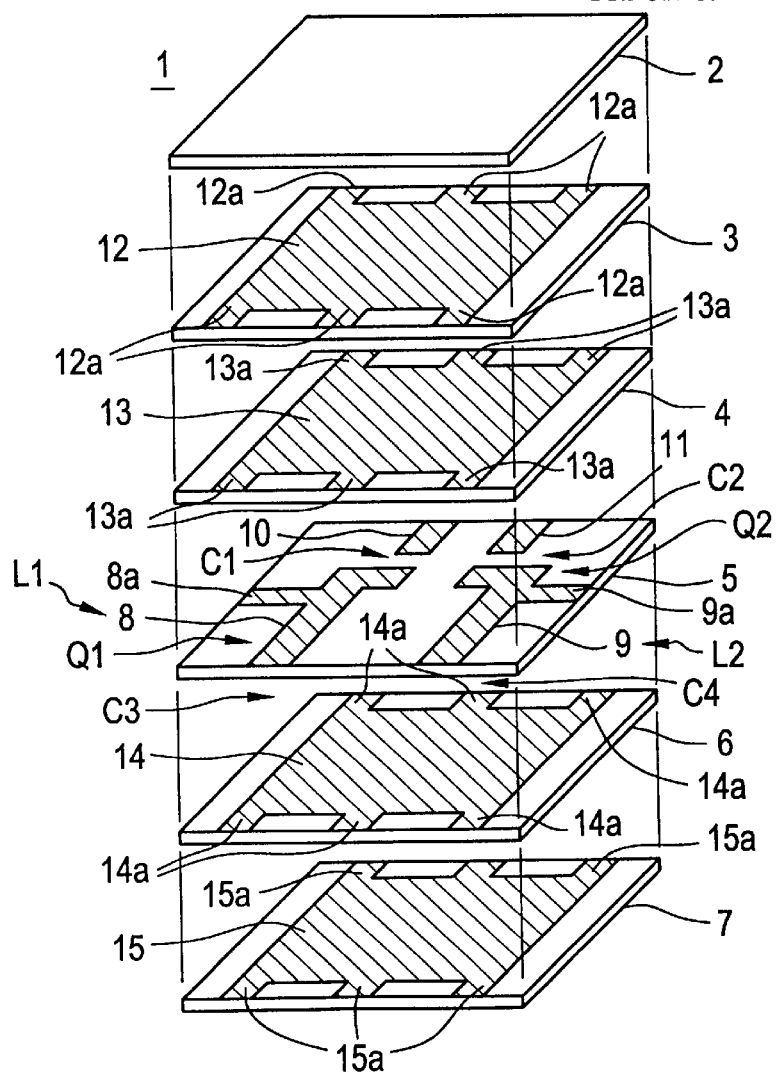
FIG. 12 shows an exploded perspective view of a conventional multilayer LC composite component.
Figure 13:
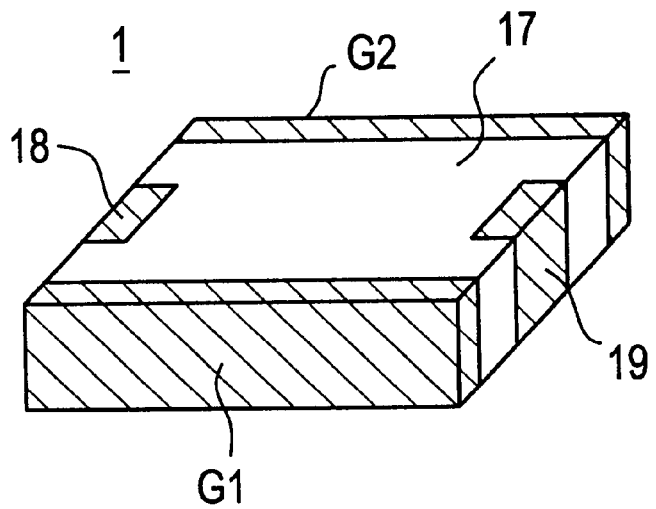
FIG. 13 shows an external perspective view of the multilayer LC composite component shown in FIG. 12.
Figure 14:
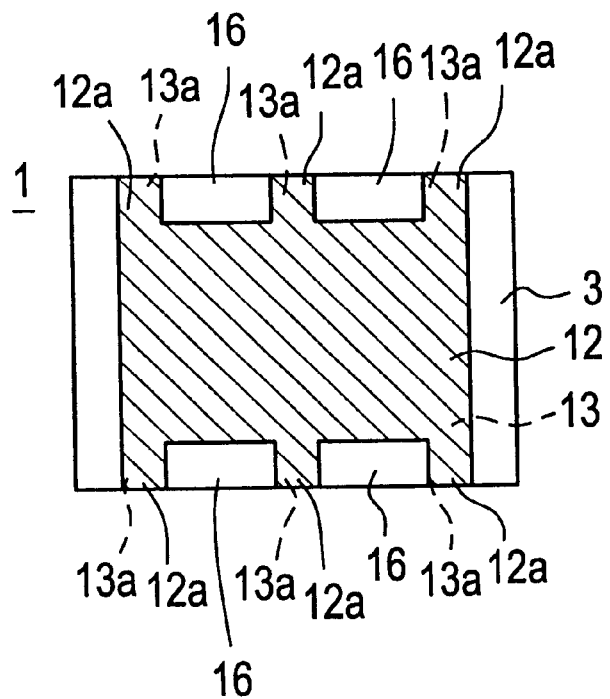
FIG. 14 shows a plan perspective view of ground patterns included in the multilayer LC composite component shown in FIG. 13.

According to a first preferred embodiment, the present invention provides a multilayer LC filter applied to the conventional multilayer LC filter 1 shown in FIG. 12. FIG. 1 illustrates the structure of a multilayer LC filter 21 according to this first preferred embodiment of the present invention. FIG. 2 shows an external perspective view of the LC filter 21 and FIG. 3 shows an electrically equivalent circuit diagram of the LC filter 21.

As shown in FIG. 1, the multilayer LC filter 21 preferably includes an insulation sheet 5 having inductor patterns 8 and 9 and resonant capacitor patterns 10 and 11 disposed on the surface thereof, an insulation sheet 3 having a ground pattern 22, an insulation sheet 4 having a ground pattern 23, an insulation sheet 6 having a ground pattern 24, and an insulation sheet 7 having a ground pattern 25. The insulation sheets 2 to 7 are preferably made of a mixture of dielectric ceramic powder or magnetic ceramic powder with a binding agent and other suitable material. The patterns 8 to 11 and the patterns 22 to 25, which are preferably formed of Ag, Pd, Cu, Ni, Au, Ag—Pd, or other suitable material, are arranged on the sheets by printing or other suitable methods.

The reversed-L-shaped inductor patterns 8 and 9 having fixed pattern widths are arranged to be substantially parallel to each other in a direction from the front to the back on the insulation sheet 5. One end of each of the inductor patterns 8 and 9 is exposed on the front edge of the sheet 5 to define grounded ends and the other ends of the patterns 8 and 9 are open-circuited ends. The inductor pattern 8 defines an inductor L1 and the inductor pattern 9 defines an inductor L2. The axes of the inductors L1 and L2 are substantially parallel to the direction extending from the front to the back on the insulation sheet 5. Then, when a current flows through each of the inductors L1 and L2, around each of the inductors L1 and L2, there is generated a magnetic field rounding substantially perpendicularly to the axial direction of each of the inductors L1 and L2.

An extended portion 8a of the inductor pattern 8 is exposed on the left edge of the sheet 5 and an extended portion 9a of the inductor pattern 9 is exposed on the right edge of the sheet 5. The lengths of the inductor patterns 8 and 9 are preferably equal to about $\lambda/4$, in which the symbol $\lambda$ denotes the wavelength of the central frequency.

The resonant capacitor patterns 10 and 11 are arranged at the back on the sheet 5. The resonant capacitor pattern 10 opposes the open-circuited end of the inductor pattern 8 to define a capacitor C1. In addition, the inductor pattern 8 opposes the ground patterns 22 to 25 to generate a distributed capacitance. A capacitor C3 defined by the distributed capacitance, the capacitor C1, and the inductor L1 constitute an LC resonator Q1. Furthermore, the resonant capacitor pattern 11 opposes the open-circuited-end of the inductor pattern 9 to define a capacitor C2. Then, the inductor pattern 9 opposes the ground patterns 22 to 25 to generate a distributed capacitance. A capacitor C4 defined by the distributed capacitance, the capacitor C2, and the inductor L2 constitute an LC resonator Q2.

The open-circuited-ends of the inductor patterns 8 and 9 are opposed in proximity to each other to define a capacitance. The resulting capacitance is a coupling capacitor Cs coupling the resonators Q1 and Q2. Furthermore, a mutual inductance M is generated between the resonators Q1 and Q2 to magnetically couple the resonators Q1 and Q2. Then, sandwiching the patterns 8 to 11 therebetween, the ground patterns 22 and 23 having large areas are arranged in the upper section and the ground patterns 24 and 25 having large areas are arranged in the lower section.

The insulation sheets 2 to 7 are stacked together to be integrally burned so as to constitute a multilayer body 30 shown in FIG. 2. An input terminal 31 is arranged on the right end surface of the multilayer body 30 and an output terminal 32 is arranged on the left end surface thereof. On the front surface of the multilayer body 30 there is disposed a ground terminal G1, and on the back surface thereof there is disposed a ground terminal G2. The input terminal 31 is connected to the extended portion 8a of the inductor pattern 8, and the output terminal 32 is connected to the extended portion 9a of the ground pattern 9. The ground terminal G1 is connected to the grounded ends of the inductor patterns 8 and 9 and one-side ends 22a to 25a of the ground patterns 22 to 25. The ground terminal G2 is connected to the resonant capacitor patterns 10 and 11 and the remaining-side ends 22a to 25a of the ground patterns 22 to 25.

FIG. 3 shows an electrically equivalent circuit diagram of the multilayer LC filter 21 constructed in the above-described manner. The resonators Q1 and Q2 are electromagnetically coupled to each other via the coupling capacitor Cs and the mutual inductance M to constitute a two-stage filter. First ends of the inductors L1 and L2 of the resonators Q1 and Q2, which are the open-circuited ends of the inductor patterns 8 and 9, are connected to first ends of the capacitors C1 and C2. The second ends of the capacitors C1 and C2 are grounded. The second ends of the inductors L1 and L2 are also grounded.

Figure 4:
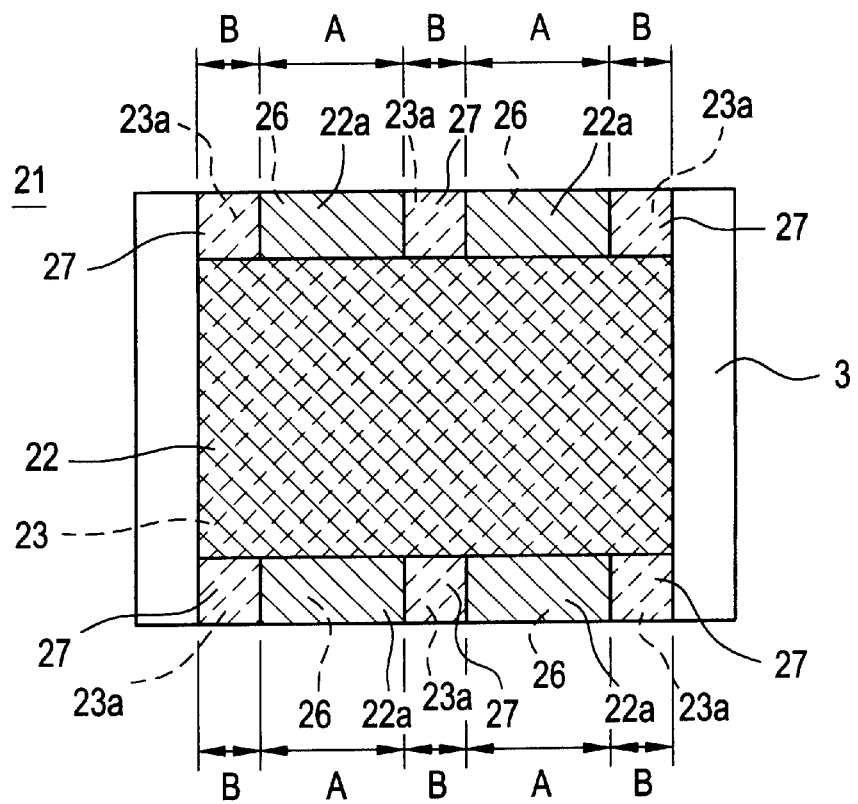
FIG. 4 shows a plan perspective view of ground patterns included in the multilayer LC composite component shown in FIG. 2.

In the multilayer LC filter 21 having the above-described structure, as shown in FIG. 4, the extended portions 22a and 23a of the ground patterns 22 and 23 and the extended portions 24a and 25a of the ground patterns 24 and 25 are arranged in different positions in plan view. With this arrangement, magnetic fields generated at the extended portions 22a and 23a and magnetic fields generated at the extended portions 24a and 25a do not converge on the same portions of the device. As a result, in the LC filter 21, the inductances of the extended portions 22a to 25a of the ground patterns 22 to 25 are minimized and become negligibly small.

Next, a detailed explanation of an example of preferred embodiments of the present invention will be provided by using specific figures. When the dimensions of the insulation sheets 2 to 7 are set to be in a range between approximately 1 mm and approximately 10 mm in length and about 0.5 mm to about 6.3 mm in width, the pattern widths A and B of the extended portions 22a to 25a of the ground patterns 22 to 25 are usually set to be in a range between about 0.1 mm and about 4 mm. In other words, the pattern widths A and B are preferably within a range between about 10% and about 40% of the lengths of the sheets 2 to 7. In the LC filter 21 of the first preferred embodiment, the pattern widths A of the each two extended portions 22a and 24a arranged at the front and back on the sheets 3 and 6 are preferably within a range between about 0.1 mm and about 3 mm, which is equivalent to about 10% to about 30% of the lengths of the sheets 3 and 6. The pattern widths B of the each three extended portions 23a and 25a at the front and back on the sheets 4 and 7 are preferably within a range of between about 0.1 mm and about 2.5 mm, which is equivalent to about 10% to about 25% of the sheets 4 and 7.

In addition, openings 27 formed on both sides of the extended portions 22a of the ground pattern 22 and between the portions 22a are closed with the extended portions 23a of the ground pattern 23 such that there is no clearance in plan view. Similarly, openings 26 formed between the extended portions 23a of the ground pattern 23 are closed by the extended portions 22a of the ground pattern 22 such that no clearance is left between the extended portions 22a and 23a in plan view. In other words, in the direction in which the insulation sheets 2 to 7 are stacked, the extended portions 22a and 23a of the adjacent ground patterns 22 and 23 stacked above the LC resonators Q1 and Q2 are arranged such that no clearance is left between the portions 22a and 23a in plan view. Similarly, the adjacent extended portions 24a and 25a of the ground patterns 24 and 25 stacked below the LC resonators Q1 and Q2 are arranged such that no clearance is left between the portions 24a and 25a in plan view. As a result, electromagnetic waves generated inside the filter 21 do not leak outside.

Furthermore, the pattern widths of the extended portions 22a to 25a are slightly broadened. Thus, even when the positions of the extended portions 22a to 25a deviate due to variations occurring when manufactured, no clearance or opening is left between the extended portions 22a to 25a in plan view. Consequently, regardless of deviations in the positions of the extended portions 22a to 25a caused by such variations, no change occurs in the capacitances of the capacitors C3 and C4 including the ground patterns 22 to 25 and the inductor patterns 8 and 9. Thus, the characteristics of the multilayer LC filter 21 do not vary significantly.

Since the ground pattern 25 defining the lowest layer is close to the mounting surface of the LC filter 21, it is resistant to the influence of grounding. Thus, the ground pattern 24 arranged below the resonators Q1 and Q2 may be omitted.

Figure 5:
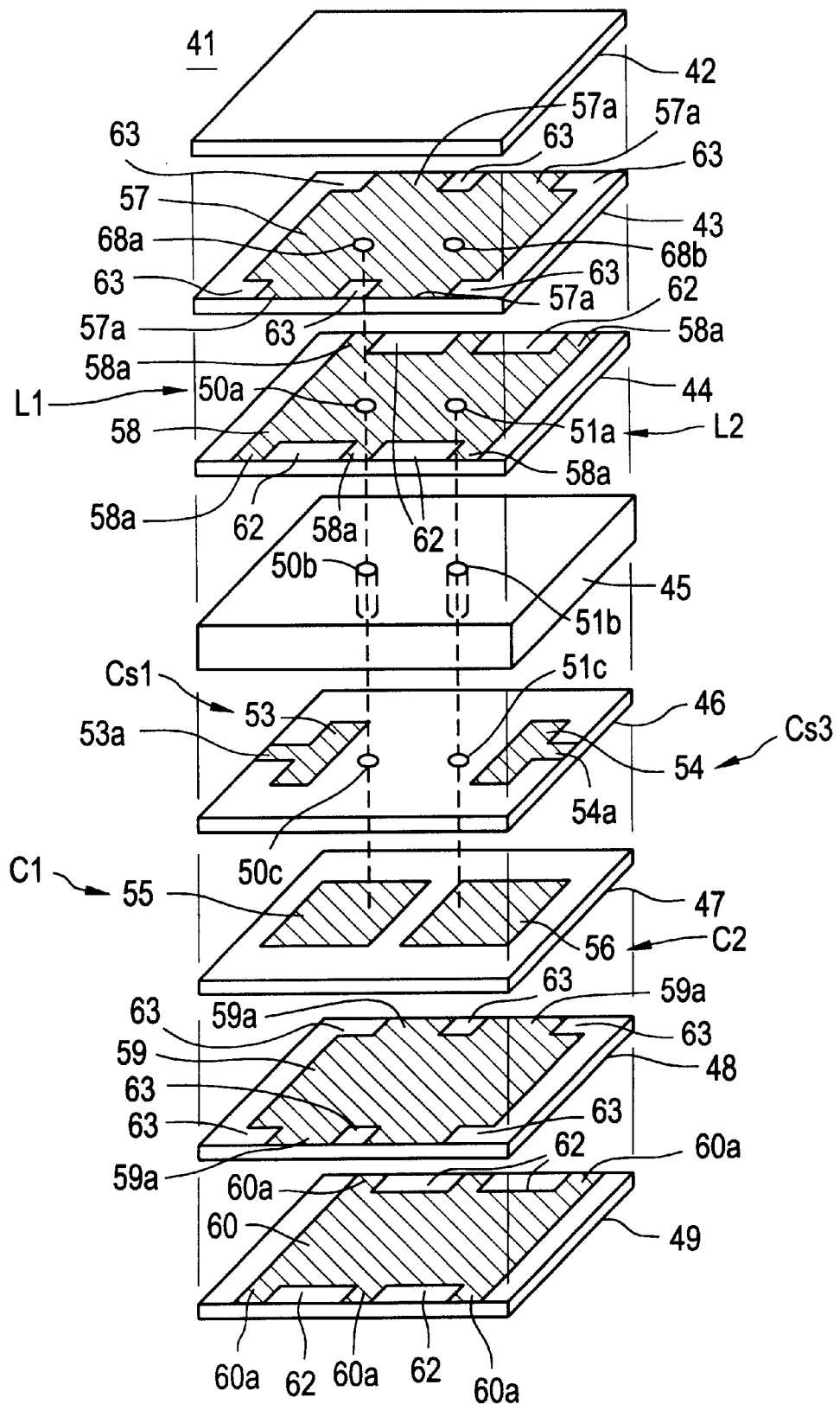
FIG. 5 shows an exploded perspective view of a multilayer LC composite component according to a second preferred embodiment of the invention.

As shown in FIG. 5, a multilayer LC filter 41 according to a second preferred embodiment of the present invention includes insulation sheets 42 to 49 having inductor via-holes 50a to 50c and 51a to 51c formed therein, input/output capacitor patterns 53 and 54, resonant capacitor patterns 55 and 56, ground patterns 57, 58, 59, and 60, and other elements disposed thereon.

The inductor via-holes 50a to 50c and 51a to 51c are connected in the direction in which the insulation sheets 42 to 49 are stacked to constitute pillar inductors L1 and L2 having lengths of approximately $\lambda/4$. The axial directions of the inductors L1 and L2 are preferably substantially perpendicular to the surfaces of the sheets 42 to 49. When currents flow through the inductors L1 and L2, magnetic fields rounding substantially perpendicularly to the axial directions of the inductors L1 and L2 are generated around the inductors L1 and L2. First ends of the inductors L1 and L2 (the via-holes 50a and 51a) are connected to the ground patterns 57 and 58 via connecting via-holes 68a and 68b to be short-circuited. Second ends of the inductors L1 and L2 (the via-holes 50c and 51c) are connected to the resonant capacitor patterns 55 and 56.

The inductor via-holes 50a to 51c and the connecting via-holes 68a and 68b are formed by making holes having desired shapes in the insulation sheets 43 to 46 with a die, a laser, or other suitable tool or process, and then filling a conductive material such as Ag, Pd, Cu, Ni, Au, or Ag—Pd or other suitable material in the holes.

The insulation sheet 45 is preferably thicker than the other sheets to adjust or increase the inductances of the inductors L1 and L2 including the inductor via-holes. In relation to the capacitance values of input/output capacitors Cs1 and Cs3, which will be described below, in the second preferred embodiment of the present invention, the insulation sheet 45 is preferably thicker than the insulation sheet 46. However, for example, when the capacitances of the input/output capacitors Cs1 and Cs3 are small, or when the insulation sheet 46 has a high permittivity, it is necessary to increase the distance between the resonant capacitor patterns 55 and 56 and the input/output capacitor patterns 53 and 54. In such a situation, the insulation sheet 46 may be thicker than the insulation sheet 45. Additionally, the insulation sheet 45 may be one thick sheet or may be formed by stacking a plurality of sheets that are as thin as the insulation sheet 46.

The extended portions 57a to 60a of the ground patterns 57 to 60 are exposed on the front and back edges of the sheets 43, 44, 48, and 49. Between the ground patterns 57 and 58 and the ground patterns 59 and 60, there are arranged the resonant capacitor patterns 55 and 56 and the inductor via-holes 50a to 51c.

The resonant capacitor patterns 55 and 56 are opposed to the ground pattern 59 via the insulation sheet 47 to define the resonant capacitors C1 and C2. The resonant capacitor pattern 55 is connected to one end (via-hole 50c) of the inductor L1. The inductor L1 and the capacitor C1 define an LC resonator Q1. The resonant capacitor pattern 56 is connected to one end (via-hole 51c) of the inductor L2. The inductor L2 and the capacitor C2 define an LC resonator Q2. The resonant capacitor patterns 55 and 56 are opposed to each other and define a coupling capacitor Cs2 that couples the LC resonators Q1 and Q2 together.

The input/output capacitor patterns 53 and 54 disposed on the insulation sheet 46 oppose the resonant capacitor patterns 55 and 56 to define an input capacitor Cs1 and an output capacitor Cs3. The extended portion 53a of the input capacitor pattern 53 is exposed on the left edge of the sheet 46 and the extended portion 54a of the output capacitor pattern 54 is exposed on the right edge of the sheet 46.

Figure 6:
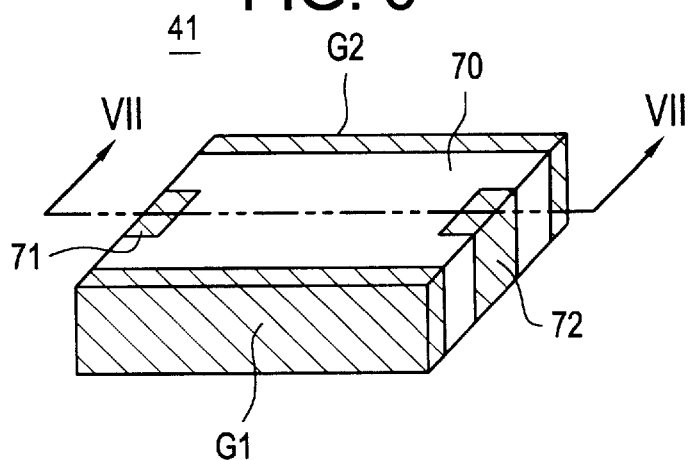
FIG. 6 shows an external perspective view of the multilayer LC composite component shown in FIG. 5.
Figure 7:
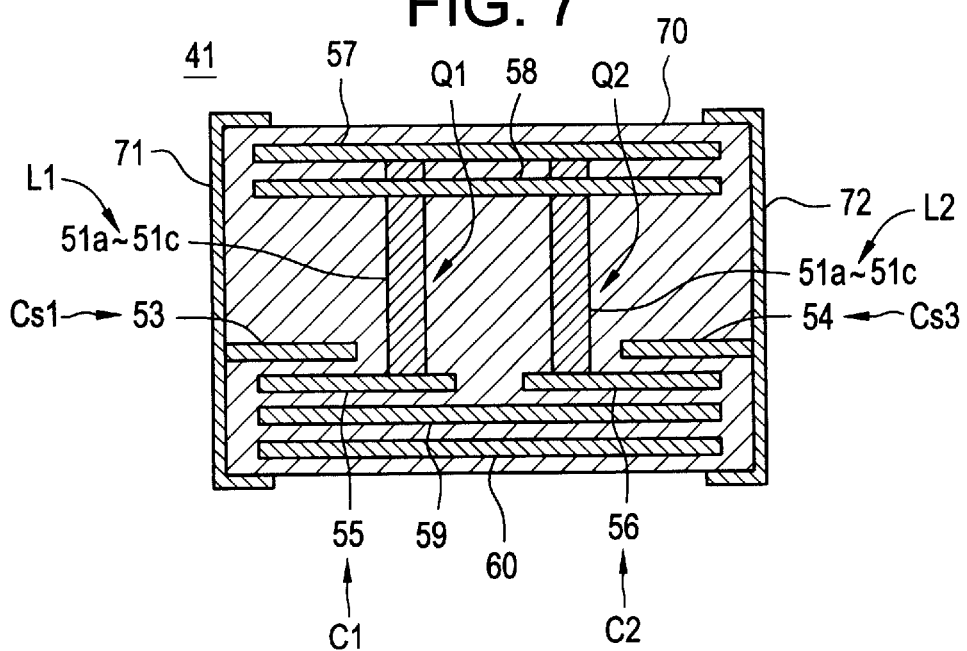
FIG. 7 shows a sectional view of the multilayer LC composite component shown in FIG. 6.

The sheets 42 to 49 are stacked in sequence as shown in FIG. 5 and are integrally burned to constitute a multilayer body 70, which is, for example, approximately 3.2 mm long, 2.5 mm wide, and 1.4 mm thick, shown in FIGS. 6 and 7. There are formed an input terminal 71 and an output terminal 72 on the right and left end surfaces of the multilayer body 70. A ground terminal G1 is formed on the front surface of the body 70 and a ground terminal G2 is formed on the back surface thereof. The input terminal 71 is connected to the input capacitor pattern 53 and the output terminal 72 is connected to the output capacitor pattern 54. The ground terminals G1 and G2 are connected to the ground patterns 57 to 60.

Figure 8:
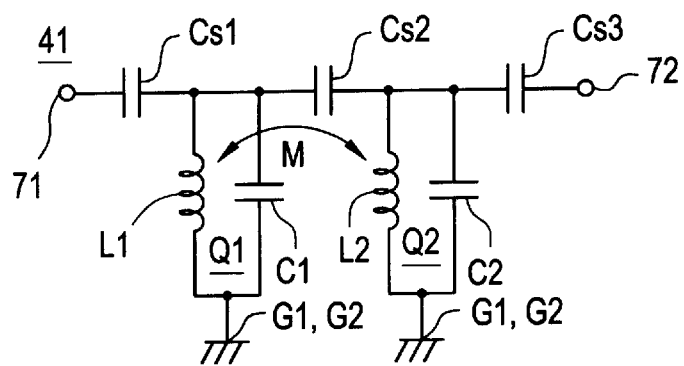
FIG. 8 shows an electrically equivalent circuit diagram of the multilayer LC composite component shown in FIG. 6.

FIG. 8 shows an electrically equivalent circuit diagram of the multilayer LC filter 41 constructed according to the above-described arrangement. The resonators Q1 and Q2 are electrically connected to each other via the coupling capacitor Cs2 to define a two-stage filter. A first end of the inductor L1 of the resonator Q1 (via-hole 50c) is connected to a first end of the capacitor C1 and a first end of the inductor L2 of the resonator Q2 (via-hole 51c) is connected to a first end of the capacitor C2. Second ends (via-holes 50a and 51a) of the inductors L1 and L2 are electrically connected to the ground pattern 58.

In the multilayer LC filter 41 having the above-described unique and novel structure, the pillar inductors L1 and L2 are directly connected to the ground patterns 57 and 58 to be extended to the ground terminals G1 and G2 via the extended portions 57a and 58a of the ground patterns 57 and 58. As a result, since a signal passes through the extended portions 57a and 58a, the inductance components of the extended portions 57a and 58a have significant influences thereon. On the other hand, as shown in FIG. 5, the extended portions 57a and 58a of the ground patterns 57 and 58 or the extended portions 59a and 60a of the ground patterns 59 and 60 are arranged in mutually different positions in plan view. Thus, magnetic fields generated at the extended portions 57a and 58a and the extended portions 59a and 60a do not converge on the same portions of the device. Thus, since the inductances of the extended portions 57a to 60a of the ground patterns 57 to 60 are minimized and become negligibly small, the multilayer LC filter 41 achieves excellent filter characteristics.

In addition, openings 63 are formed on both sides of the extended portions 57a of the ground pattern 57 and between the extended portions 57a. The openings 63 are closed with the extended portions 58a of the ground pattern 58 such that no clearance is left between the portions 57a and 58a in plan view. Similarly, openings 62 are formed between the extended portions 58a of the ground pattern 58, and the openings 62 are closed with the extended portions 57a of the ground pattern 57 such that no clearance is left between the portions 57a and 58a in plan view. In other words, in the direction in which the insulation sheets 42 to 49 are stacked, the extended portions 57a and 58a of the adjacent ground patterns 57 and 58 stacked above the LC resonators Q1 and Q2 are arranged leaving no clearance between them in plan view. Similarly, the extended portions 59a and 60a of the adjacent ground patterns 59 and 60 stacked below the LC resonators Q1 and Q2 are arranged leaving no clearance between them in plan view. As a result, electromagnetic waves generated inside the filter 41 do not leak outside.

The multilayer LC composite component of the present invention is not limited to the preferred embodiments described above, and various modifications and changes can be made within the scope of the invention.

Figure 9:
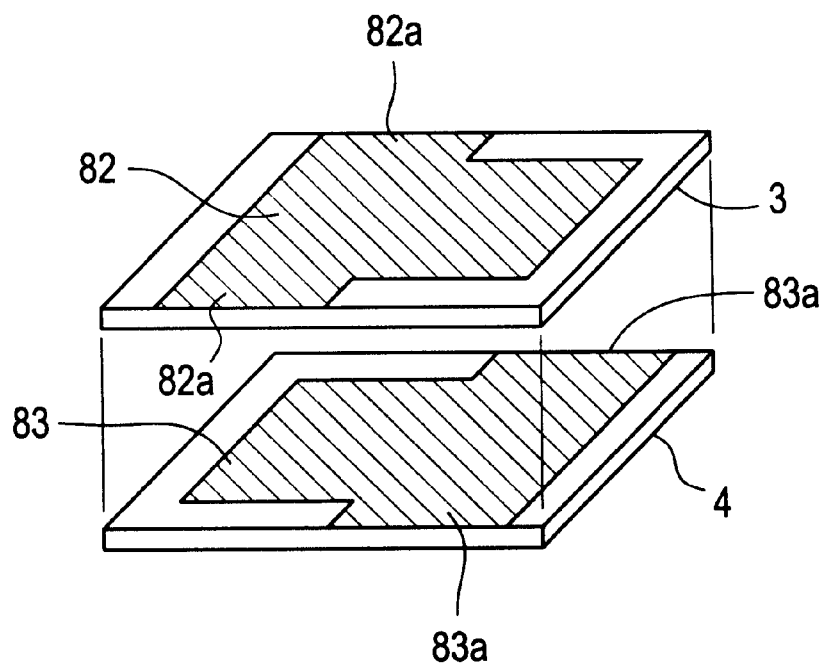
FIG. 9 shows a partial exploded perspective view of a modified example of ground patterns.
Figure 10:
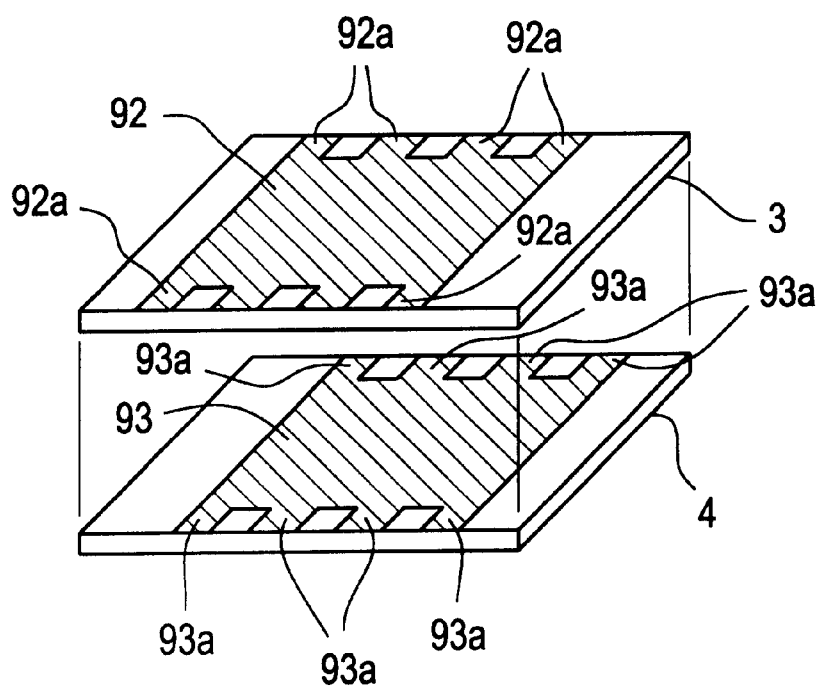
FIG. 10 shows a partial exploded perspective view of another modified example of ground patterns.
Figure 11:
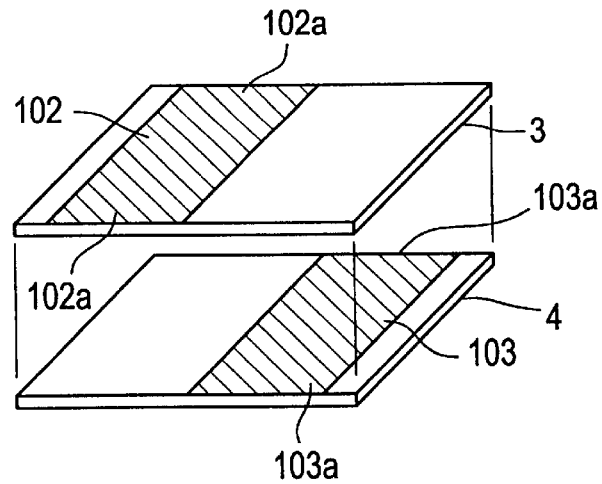
FIG. 11 shows a partial exploded perspective view of another modified example of ground patterns.

The configurations of the ground patterns may be arbitrarily set, although the extended portions should preferably be arranged in mutually different positions in plan view. For example, as shown in FIG. 9, the extended portions 82a of the ground pattern 82 disposed on the insulation sheet 3 may be arranged substantially at the front and back edges in the left area of the sheet 3, and the extended portions 83a of the ground pattern 83 disposed on the insulation sheet 4 may be arranged substantially at the front and back edges in the right area of the sheet 4. Additionally, as shown in FIG. 10, ground patterns 92 and 93 having the same configurations may be arranged on the sheets 3 and 4 by deviating from each other so that extended portions 92a and 93a are arranged in mutually different positions in plan view. Alternatively, as shown in FIG. 11, a ground pattern 102 may be arranged substantially in the left area of the insulation sheet 3 and a ground pattern 103 may be arranged substantially in the right area of the insulation sheet 4. In this case, similarly, extended portions 102a of the ground pattern 102 will be arranged substantially on the left side from the front edge to the back edge of the insulation sheet 3 and extended portions 103a of the ground pattern 103 may be arranged substantially on the right side from the front edge to the back edge of the insulation sheet 4.

As the LC composite component of various preferred embodiments of the present invention, for example, there may be a band pass filter, a low pass filter, a high pass filter. In addition, as other kinds of LC composite components, there may be any of duplexers produced by combining band pass filters, low pass filters, high pass filters, or trap circuits, respectively. Alternatively, there may be a duplexer produced by combining these different kinds of circuits. Moreover, other than such a duplexer, the LC composite component of the present invention may be formed by containing a plurality of filters in a single multilayer body, such as a triplexer or a multiplexer.

In preferred embodiments of the present invention described above, after stacking the insulation sheets having the conductive patterns and the via-holes, the sheets are preferably integrally burned. However, the present invention is not restricted to this method. The insulation sheets may be burned in advance. Alternatively, the LC composite component may be produced in the following manner. That is, after forming an insulation layer with an insulation paste by printing or other suitable process, a conductive paste is applied on the insulation layer to form a conductive pattern and a via-hole. Next, an insulation paste is applied on the layer to form an insulation layer. Similarly, by sequentially applying the insulation paste, an LC composite component having a multilayer structure can be obtained.

As clarified in the above description, in the multilayer LC composite component of various preferred embodiments of the present invention, since the extended portions of the plurality of ground patterns are arranged in different positions in plan view, magnetic fields generated at the extended portions do not converge on the same parts. Consequently, the inductances of the extended portions of the ground patterns are minimized. Moreover, when the extended portions are arranged such that no clearance is left between them in plan view, the leakage of electromagnetic waves generated inside the filter is prevented. As a result, in the multilayer LC composite component, since the inductances of the ground patterns are minimized, the generated electromagnetic waves do not leak outside.

While the present invention has been particularly shown and described with reference to preferred embodiments thereof, it will be understood by those skilled in the art that the foregoing and other changes in form and details can be made without departing from the spirit and scope of the present invention.

What is claimed is:

1. A multilayer LC composite component comprising:
   a plurality of insulation layers stacked to define a multilayered body;
   an inductor and a capacitor disposed in the multilayer body to define an LC resonator;
   at least two ground patterns arranged on different ones of the insulation layers that are adjacent to each other and including extended portions; and
   external ground electrode disposed on the multilayered body, the at least two ground patterns being electrically connected to the external ground electrode via the extended portions; wherein
   the extended portions of the at least two ground patterns are arranged in the multilayered body at different positions in plan view;
   openings are formed on both sides of the extended portions of one of the at least two ground patterns; and
   the openings formed on both sides of the extended portions of the one of the at least two ground patterns are closed with the extended portions of the other of the at least two ground patterns.

2. A multilayer LC composite component according to claim 1, wherein the extended portions of the ground patterns are arranged such that no clearance is left between the respective extended portions in plan view.

3. A multilayer LC composite component according to claim 1, further comprising:
   at least one via-hole connected in the direction in which the insulation layers are stacked to define the inductor; and
   a capacitor pattern arranged to define the capacitor;
   wherein one end of the inductor is electrically connected to the capacitor pattern of the capacitor to define the LC resonator and the other end of the inductor is electrically connected to at least one of the at least two ground patterns.

4. A multilayer LC composite component according to claim 1, wherein the multilayer LC composite component is one of a band pass filter, a low pass filter, a high pass filter, a duplexer, a triplexer, and a multiplexer.

5. A multilayer LC composite component according to claim 1, wherein the extended portions of the ground patterns are arranged such that magnetic fields generated at the extended portions of the ground patterns do not converge on the same portion of the multilayered body.

6. A multilayer LC composite component according to claim 1, wherein each of the insulation sheets has a length of about 1 mm to about 10 mm and a width of about 0.5 mm to about 6.3 mm, and pattern widths of the extended portions of the ground patterns are within a range of about 0.1 mm and about 4 mm.

7. A multilayer LC composite component according to claim 1, wherein pattern widths of the extended portions of the ground patterns are within a range of about 10% and about 40% of lengths of the insulation sheets.

8. A multilayer LC composite component according to claim 1, further comprising a plurality of LC resonators and a coupling capacitor, wherein the plurality of LC resonators are electrically connected to each other via the coupling capacitor to define a two-stage filter.

9. A multilayer LC composite component according to claim 1, wherein one of the extended portions of the ground patterns is arranged along front and back edges in the left area of a first of the insulation sheets, and another of the extended portions of the ground patterns is arranged along the front and back edges in the right area of a second of the insulation sheets.

10. A multilayer LC composite component according to claim 1, wherein the inductor includes inductor via-holes that are connected in the direction in which the insulation sheets stacked to constitute pillar inductors having lengths of approximately $\lambda/4$, wherein $\lambda$ is the wavelength of the central frequency of the multilayer LC composite component.

11. A multilayer LC composite component according to claim 1, wherein the inductor includes inductor via-holes that are connected in the direction in which the insulation sheets stacked to constitute pillar inductors, the pillar inductors being directly connected to the ground patterns to be extended to the ground terminals via the extended portions of the ground patterns.

12. A multilayer LC composite component according to claim 1, wherein the extended portions of the ground patterns are exposed on the front and back edges of the insulation sheets.

13. A multilayer LC composite component comprising:
    a plurality of insulation layers stacked to define a multilayered body;
    an inductor and a capacitor disposed in the multilayer body to define an LC resonator;
    at least two ground patterns arranged on different ones of the insulation layers that are adjacent to each other and including extended portions; and
    an external ground electrode disposed on the multilayered body, the at least two ground patterns being electrically connected to the external ground electrode via the extended portions; wherein
    the extended portions of the at least two ground patterns are arranged such that magnetic fields generated at the extended portions of the ground patterns do not converge on the same portion of the multilayered body;
    openings are formed on both sides of the extended portions of one of the at least two ground patterns; and
    the openings formed on both sides of the extended portions of the one of the at least two ground patterns are closed with the extended portions of the other of the at least two ground patterns.

14. A multilayer LC composite component according to claim 13, wherein the extended portions of the ground patterns are exposed on the front and back edges of the insulation sheets.

15. A multilayer LC composite component according to claim 13, wherein one of the extended portions of the round patterns is arranged along front and back edges in the left area of a first of the insulation sheets, and another of the extended portions of the ground patterns is arranged along the front and back edges in the right area of a second of the insulation sheets.

16. A multilayer LC composite component according to claim 13, wherein the extended portions of the ground patterns are arranged such that no clearance is left between the respective extended portions in plan view.

17. A multilayer LC composite component according to claim 13, further comprising:
- at least one via-hole connected in the direction in which the insulation layers are stacked to define the inductor; and
- a capacitor pattern arranged to define the capacitor;

wherein one end of the inductor is electrically connected to the capacitor pattern of the capacitor to define the LC resonator and the other end of the inductor is electrically connected to at least one of the at least two ground patterns.

18. A multilayer LC composite component according to claim 13, wherein the mutlilayer LC composite component is one of a band pass filter, a low pass filter, a high pass filter, a duplexer, a triplexer, and a multiplexer.

* * * * *